United States Patent
Briere et al.

(10) Patent No.: US 8,803,199 B2
(45) Date of Patent: *Aug. 12, 2014

(54) III-NITRIDE SEMICONDUCTOR DEVICE WITH STEPPED GATE

(71) Applicant: International Rectifier Corporation, El Segundo, CA (US)

(72) Inventors: Michael A. Briere, Scottsdale, AZ (US); Paul Bridger, Altadena, CA (US); Jianjun Cao, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/965,421

(22) Filed: Aug. 13, 2013

(65) Prior Publication Data

US 2014/0034959 A1  Feb. 6, 2014

Related U.S. Application Data

(63) Continuation of application No. 13/721,573, filed on Dec. 20, 2012, now Pat. No. 8,536,624, which is a continuation of application No. 12/008,190, filed on Jan. 9, 2008, now Pat. No. 8,338,861.

(60) Provisional application No. 60/884,272, filed on Jan. 10, 2007.

(51) Int. Cl.
    *H01L 29/66* (2006.01)

(52) U.S. Cl.
    USPC .......................................... 257/194; 438/172

(58) Field of Classification Search
    CPC ....................................................... H01L 29/778
    USPC .................................. 257/192, 194; 438/172
    See application file for complete search history.

(56) References Cited

U.S. PATENT DOCUMENTS

| | | | |
|---|---|---|---|
| 8,049,252 B2 * | 11/2011 | Smith et al. | 257/194 |
| 8,338,861 B2 * | 12/2012 | Briere et al. | 257/194 |
| 8,524,601 B2 | 9/2013 | Kurahashi | |
| 8,536,624 B2 * | 9/2013 | Briere et al. | 257/194 |
| 2007/0018199 A1 * | 1/2007 | Sheppard et al. | 257/200 |
| 2009/0189187 A1 | 7/2009 | Briere | |
| 2011/0057257 A1 | 3/2011 | Park | |
| 2012/0223319 A1 | 9/2012 | Dora | |
| 2012/0267687 A1 | 10/2012 | Jeon | |

* cited by examiner

*Primary Examiner* — Mark Prenty

(74) *Attorney, Agent, or Firm* — Farjami & Farjami LLP

(57) ABSTRACT

A III-nitride heterojunction power semiconductor device that includes a passivation body with a gate well having a top mouth that is wider than the bottom mouth thereof, and a method of fabrication for the same.

14 Claims, 2 Drawing Sheets

III-NITRIDE SEMICONDUCTOR DEVICE WITH STEPPED GATE

This is a continuation of application Ser. No. 12/008,190 filed Jan. 9, 2008.

RELATED APPLICATION

This application is a continuation of application Ser. No. 13/721,573 filed on Dec. 20, 2012, now U.S. Pat. No. 8,536,624, which is itself a continuation of and claims the benefit of and priority to application Ser. No. 12/008,190, filed Jan. 9, 2008, now U.S. Pat. No. 8,338,861, which in turn is based on and claims benefit of U.S. Provisional Application No. 60/884,272, filed on Jan. 10, 2007, entitled Active Area Shaping for III-Nitride Device and Process for its Manufacture, to which a claim of priority is hereby made and the disclosure of which is incorporated by reference.

FIELD OF THE INVENTION

The present invention relates to semiconductor devices and more particularly to III-nitride based semiconductor devices and methods of fabrication thereof.

DEFINITION

III-nitride refers to a semiconductor alloy from the InAlGaN system including, but not limited to, GaN, AlGaN, InGaN, AlN, InN, InAlGaN and the like.

BACKGROUND OF THE INVENTION

Referring to FIG. 1, a known III-nitride heterojunction type power semiconductor device includes substrate 10, a III-nitride (e.g. AlN) buffer layer 12 formed over substrate 10, and III-nitride heterojunction 14 formed over buffer layer 12. III-nitride heterojunction 14 includes a first III-nitride body (e.g. GaN) 16 of one bandgap, and a second III-nitride body (e.g. AlGaN) 18 of another bandgap formed over first III-nitride body 16. The composition of first and second III-nitride bodies 16, 18 are selected to cause the formation of a carrier rich region referred to as a two-dimensional electron gas (2-DEG) at or near the heterojunction of the two bodies. The 2-DEG serves as the conduction channel between a first power electrode (e.g. source electrode) 20, and second power electrode (e.g. drain electrode) 22. Note that, typically, each power electrode 20, 22 is ohmically coupled to second III-nitride body 18 and thus electrically coupled through the same to the 2-DEG.

A typical device may further include a passivation body 24 made of a dielectric or the like formed over second III-nitride body 18, and a gate 26 disposed between first and second power electrodes 20, 33 to selectively interrupt/restore the 2-DEG therebetween, whereby the device may be operated as a switch. Note that gate 26 may include a gate dielectric body 30, and gate electrode 32.

Power electrodes 20, 22 as well as gate 26 extend through passivation body 24 to heterojunction 14, i.e. to second III-nitride body 18. Specifically, each extends through a trench (well) inside passivation body 24. The trench/well in which gate 26 is received includes vertical sidewalk that form sharp corners 28 with the top surface of second III-nitride body 18, creating high field regions at the bottom corners of gate 26 which reduce the breakdown voltage of the device. Further, vertical sidewalks that meet at second III-nitride body 18 increase the overlap between the gate electrode and the 2-DEG causing a high Qgd.

It would be desirable to reduce Qgd and increase the breakdown voltage of a III-nitride semiconductor device.

SUMMARY OF THE INVENTION

In accordance with the invention, the trench or well receiving the gate includes ledges at the corners thereof. The ledges at the corners increase device breakdown voltage and minimize gate to drain capacitance to reduce $Q_{gd}$.

In a process for the fabrication of a device according to the present invention, a III-nitride heterojunction is formed over a suitable substrate. A first nitride dielectric layer, for example, $Si_3N_4$, is deposited atop the III-nitride heterojunction and a second field dielectric nitride layer, for example, SiNx (wherein x is a number), TiN or AlN is deposited atop the first nitride layer.

A gate well is then isotropically etched through both dielectric layers, forming a well with sharp bottom corners. A second etch, which is selective to the material of the top field nitride layer is then carried out to enlarge the opening in the top nitride layer but not the opening in the bottom nitride layer. Thus, a well is obtained having ledges at the bottom corners thereof.

According to an aspect of the present invention, the ledges in the well corners may have different lateral extents.

DETAILED DESCRIPTION OF THE FIGURES

Figure 1:
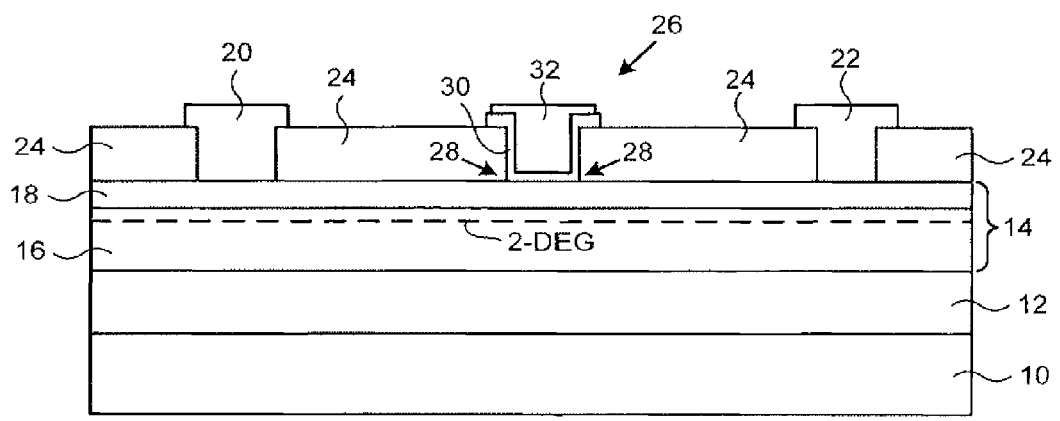
FIG. 1 illustrates a cross-sectional view of a III-nitride power semiconductor device according to the prior art.
Figure 2:
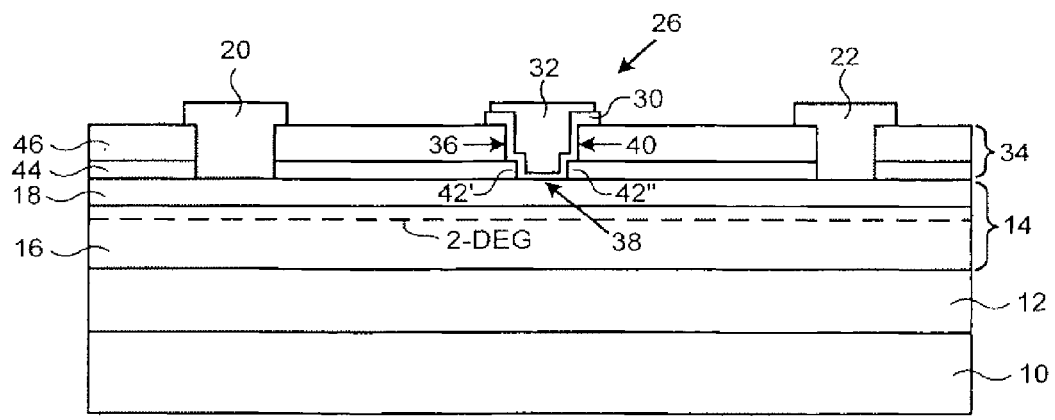
FIG. 2 illustrates a cross-sectional view of a III-nitride power semiconductor device according to the present invention.

Referring to FIG. 2, in which like numerals identify like features, a III-nitride power heterojunction device according to the present invention includes a passivation body 34 that includes a gate well (trench) 36 having a first mouth 38 at second III-nitride body 18, and a second mouth 40 wider than first mouth 38 at the top surface of passivation body 34. Note that gate well 36 is preferably a stripe-shaped trench that extends parallel to power electrodes 20, 22. Thus, gate 26 in a preferred embodiment, includes gate dielectric 30 that is disposed over second III-nitride body 18 at first mouth 38 and extends along the sidewalls of gate well 36, and a gate electrode 32 disposed inside gate well 36 over gate dielectric 30. Thus, according to one aspect of the present invention, the area overlapped by gate 26 over second III-nitride body 18 is decreased, whereby Qgd is reduced.

According to one aspect of the present invention, each sidewall of gate well 36 includes a ledge 42', 42" that extends laterally toward the interior of gate well 36 to define first mouth 38. As a result, the sharp corners present in prior art devices are avoided and replaced with a step-like feature, which increases the breakdown voltage of the device. In the preferred embodiment, one of the ledges, for example, ledge 42", that is closer to drain electrode 22 may be wider than ledge 42' which is farther from drain electrode 22, whereby, the breakdown voltage rating of the device may be further improved. For example, ledge 42' may be about 0.025 µm, while ledge 42" may be in a range between 0.05-0.1 µm wide, the width of each ledge being defined as the lateral dimension inside gate well 36.

Figure 3A:
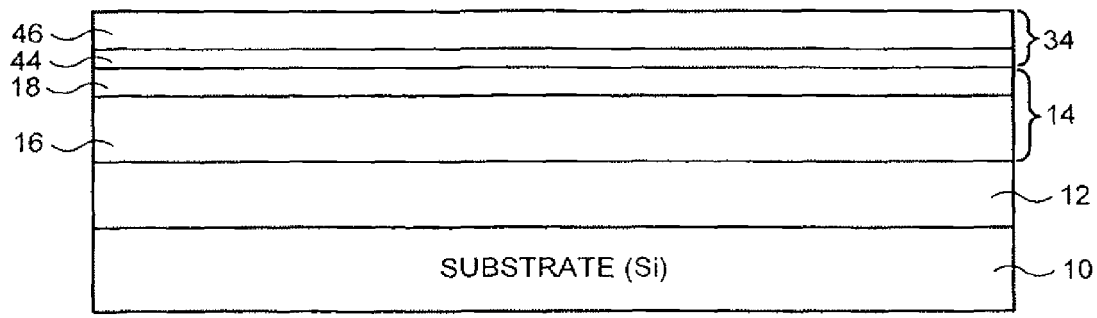
FIGS. 3A-3C illustrate steps in the fabrication of a III-nitride power semiconductor device according to the present invention.
Figure 3B:
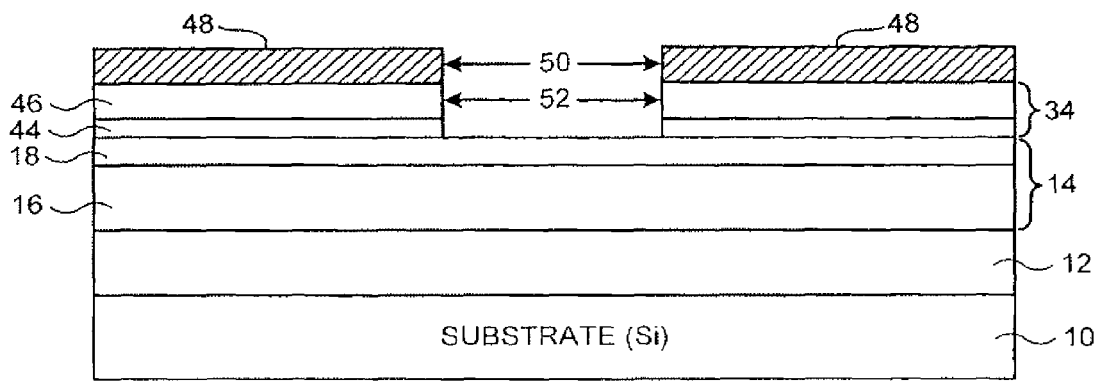
Figure 3C:
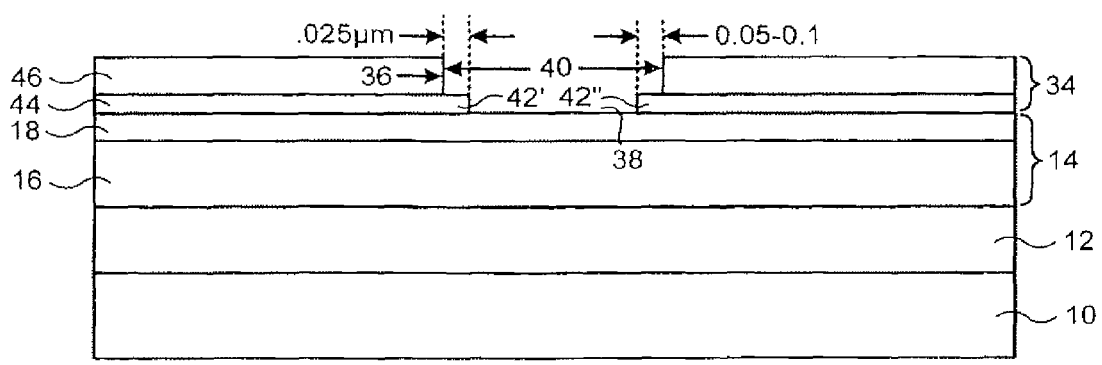

Referring now to FIGS. 3A-3C, to fabricate a III-nitride heterojunction power device according to the present invention, first a III-nitride buffer layer 12 such as AlN is grown over one face of a suitable substrate 10 such as silicon, silicon carbide, sapphire or the like. Note that buffer layer 12 may not be necessary if substrate 10 is compatible with first III-nitride body 16. For example, buffer layer 12 may not be necessary if a GaN substrate is used. After buffer layer 12 is grown, first III-nitride body 16, for example, GaN, is grown over buffer layer 12, followed by growth of a second III-nitride body 18, for example, AlGaN, to obtain a 2-DEG. Thereafter, passivation body 34 is formed by first growing or depositing a layer of first insulation (e.g. silicon nitride, $Si_3N_4$) 44 over second III-nitride body 18 followed by deposition of a second insulation body 46. First insulation body 44 is preferably about 0.05-0.1 microns thick and is made of a material that is not removable by an etchant that removes second insulation material 46. Suitable materials for second insulation body 46 include nitride field dielectrics such as AlN, TiN, SiNx, or the like.

Next, photoresistive mask 48 is deposited above second insulation body 46 and photolithographically patterned to include openings (e.g. opening 50) over passivation body 34. Thereafter, a well 52 is formed in passivation body 34 by isotropically etching through first and second insulation bodies 44, 46. Note that well 52 includes vertical sidewalls.

Next, mask 48 is removed, and in a second mask step a portion of second insulation layer 46 is removed from each sidewall of well 52 to obtain a gate well 36 according to the present invention. The second mask can be off-set from the center of the first mask opening 50 so that, as illustrated, the lateral dimension (i.e. width) of ledge 42" may be wider than the lateral dimension of ledge 42'. Thus, ledge 42' may be about 0.025 microns wide while ledge 42" may be between 0.05 to 0.1 microns wide. Thereafter, any desired set of steps can be carried out to obtain a device according to the present invention as illustrated by FIG. 2.

It should be noted that the two etch steps may be accomplished by a single etch step with an etchant which etches the two insulation bodies at different rates (i.e. etches second insulation body 46 faster than the first insulation body 44) to obtain a gate well 36 according to the present invention.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A III-nitride semiconductor device comprising:
   a first III-nitride body having one band gap, and a second III-nitride body having another band gap disposed over said first III-nitride body;
   a first insulation body situated over said second III-nitride body, and a second insulation body situated over said first insulation body;
   a gate well having a first mouth defined in said first insulation body;
   a stepped gate arrangement disposed at least partially within said gate well, said stepped gate arrangement including a gate dielectric formed along said first mouth, and a gate electrode over said gate dielectric, said gate dielectric and said gate electrode extending beyond said first mouth.

2. The III-nitride semiconductor device of claim 1, further comprising a drain electrode and a source electrode on respective sides of said stepped gate arrangement.

3. The III-nitride semiconductor device of claim 1, wherein said first insulation body comprises silicon nitride.

4. The III-nitride semiconductor device of claim 1, wherein said second insulation body comprises a nitride dielectric.

5. The III-nitride semiconductor device of claim 1, wherein said second insulation body comprises silicon nitride.

6. The III-nitride semiconductor device of claim 1, wherein said second insulation body comprises aluminum nitride.

7. The III-nitride semiconductor device of claim 1, wherein said first III-nitride body comprises GaN and said second III-nitride body comprises AlGaN.

8. A method of fabricating a III-nitride semiconductor device, said method comprising:
   forming a first III-nitride body having one band gap, and a second III-nitride body having another band gap disposed over said first III-nitride body;
   forming a first insulation body over said second III-nitride body;
   forming a second insulation body situated over said first insulation body;
   forming a gate well having a first mouth defined by first and second ledges in said first insulation body, each of said first and second ledges including an exposed top surface portion of said first insulation body;
   forming a gate dielectric along said first mouth, said gate dielectric extending beyond said first mouth to cover said exposed top surface portions of said first insulation body;
   forming a gate electrode over said gate dielectric, said gate electrode extending beyond said first mouth.

9. The method of claim 8, further comprising forming a drain electrode and a source electrode on respective sides of said gate electrode.

10. The method of claim 8, wherein said first insulation body comprises silicon nitride.

11. The method of claim 8, wherein said second insulation body comprises a nitride dielectric.

12. The method of claim 8, wherein said second insulation body comprises silicon nitride.

13. The method of claim 8, wherein said second insulation body comprises aluminum nitride.

14. The method of claim 8, wherein said first III-nitride body comprises GaN and said second III-nitride body comprises AlGaN.

* * * * *